(12) United States Patent
Tang

(10) Patent No.: US 10,453,921 B2
(45) Date of Patent: Oct. 22, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Poren Tang, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/043,040

(22) Filed: Jul. 23, 2018

(65) Prior Publication Data

US 2019/0035892 A1   Jan. 31, 2019

(30) Foreign Application Priority Data

Jul. 25, 2017 (CN) .......................... 2017 1 0611944

(51) Int. Cl.
*H01L 29/08* (2006.01)
*H01L 21/324* (2006.01)
(Continued)

(52) U.S. Cl.
CPC ........ *H01L 29/0847* (2013.01); *H01L 21/324* (2013.01); *H01L 21/823821* (2013.01); *H01L 21/823864* (2013.01); *H01L 29/1054* (2013.01); *H01L 29/6656* (2013.01); *H01L 29/785* (2013.01); *H01L 29/7848* (2013.01); *H01L 21/823814* (2013.01)

(58) Field of Classification Search
CPC ............. H01L 29/0847; H01L 29/7848; H01L 29/785; H01L 29/6656; H01L 29/1054; H01L 21/324; H01L 21/823864; H01L 21/823814

See application file for complete search history.

(56) References Cited

U.S. PATENT DOCUMENTS 5,089,865 A * 2/1992 Mitsui ................... H01L 29/665
257/384
5,547,885 A * 8/1996 Ogoh ................... H01L 29/6656
257/E21.427

(Continued)

*Primary Examiner* — Earl N Taylor
(74) *Attorney, Agent, or Firm* — Anova Law Group, PLLC

(57) ABSTRACT

Semiconductor structures and fabrication methods are provided. An exemplary fabrication method includes providing a base substrate; forming a gate structure on a top surface of the base substrate; and forming a first doped source/drain layer at both sides of the gate structure. A minimum distance between a sidewall surface of the first doped source/drain doping layer and an adjacent sidewall surface of the gate structure is a first distance. The method also includes forming a second doped source/drain layer on the first doped source/drain layer at both sides of the gate structure. A minimum distance between a sidewall surface of the second doped source/drain doping layer and an adjacent sidewall surface of the gate structure is a second distance; and the second distance is greater than the first distance.

18 Claims, 5 Drawing Sheets

(51) Int. Cl.
*H01L 29/10* (2006.01)
*H01L 21/8238* (2006.01)
*H01L 29/66* (2006.01)
*H01L 29/78* (2006.01)

(56) References Cited

U.S. PATENT DOCUMENTS

| | | | | |
|---|---|---|---|---|
| 6,124,627 | A * | 9/2000 | Rodder | H01L 21/28114 257/616 |
| 6,346,447 | B1 * | 2/2002 | Rodder | H01L 29/41783 257/E21.43 |
| 6,492,696 | B2 * | 12/2002 | Morimoto | H01L 21/76221 257/384 |
| 7,303,965 | B2 * | 12/2007 | Oowaki | H01L 21/28185 257/410 |
| 8,030,708 | B2 * | 10/2011 | Tateshita | H01L 21/28114 257/213 |
| 8,546,203 | B1 * | 10/2013 | Cheng | H01L 29/66628 257/347 |
| 8,673,699 | B2 * | 3/2014 | Adam | H01L 27/1203 257/347 |
| 8,741,725 | B2 * | 6/2014 | Johnson | H01L 21/76237 438/347 |
| 9,099,493 | B2 * | 8/2015 | Cheng | H01L 29/66772 |
| 9,673,293 | B1 * | 6/2017 | Cheng | H01L 29/4991 |
| 10,229,987 | B2 * | 3/2019 | Cheng | H01L 29/66636 |
| 2004/0045499 | A1 * | 3/2004 | Langdo | H01L 21/02381 117/84 |
| 2005/0051851 | A1 * | 3/2005 | Chen | H01L 21/823807 257/369 |
| 2005/0176220 | A1 * | 8/2005 | Kanemoto | H01L 21/2205 438/481 |
| 2006/0157797 | A1 * | 7/2006 | Tateshita | H01L 21/28114 257/369 |
| 2008/0233691 | A1 * | 9/2008 | Cheng | H01J 37/32733 438/197 |
| 2012/0080757 | A1 * | 4/2012 | Kato | H01L 21/823418 257/369 |
| 2015/0162445 | A1 * | 6/2015 | Wu | H01L 29/7848 257/344 |
| 2017/0301785 | A1 * | 10/2017 | Hu | H01L 29/785 |
| 2018/0019339 | A1 * | 1/2018 | Colinge | H01L 29/7851 |
| 2018/0323287 | A1 * | 11/2018 | Liu | H01L 29/66772 |
| 2018/0366376 | A1 * | 12/2018 | Shen | H01L 21/823814 |
| 2019/0035892 | A1 * | 1/2019 | Tang | H01L 29/0847 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710611944.6, filed on Jul. 25, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the rapid development of semiconductor manufacturing technologies, the semiconductor devices have been developed toward high device density and high integration level. As the basic semiconductor devices, transistors have been widely used. With the continuous increase of the device density and the integration level of the semiconductor devices, the size of the transistors has become smaller and smaller.

A transistor often includes a semiconductor substrate; a gate structure on the semiconductor substrate; sidewall spacers on the sidewall surfaces of the gate structure; and a doped source/drain layer in the semiconductor substrate at both sides of the gate structure. To increase the carrier mobility of the channel region of the transistor, the strained silicon technology has been introduced in the fabrication of semiconductor devices. The strained silicon technology causes the crystal lattice of the doped source/drain layer to be different from the crystal lattice of the semiconductor substrate so as to cause the doped source/drain layer to generate a stress to the channel region. Accordingly, the carrier mobility of the channel region is increased. At the same time, the gate structure, the sidewall spacers and the doped source/drain layer form capacitors. The capacitors have parasitic capacitances.

However, the semiconductor structure may be unable to match the requirements of a small parasitic capacitance and a large carrier mobility simultaneously. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate; forming a gate structure on a top surface of the base substrate; and forming a first doped source/drain layer at both sides of the gate structure. A minimum distance between a sidewall surface of the first doped source/drain layer and an adjacent sidewall surface of the gate structure is a first distance. The method also includes forming a second doped source/drain layer on the first doped source/drain layer at both sides of the gate structure. A minimum distance between a sidewall surface of the second doped source/drain layer and an adjacent sidewall surface of the gate structure is a second distance. The second distance is greater than the first distance.

Another aspect of the present disclosure includes a semiconductor structure. The semiconductor structure includes a base substrate; a gate structure formed on a top surface of the base substrate; and a first doped source/drain layer formed at both sides of the gate structure. A minimum distance between a sidewall surface of the first doped source/drain layer and an adjacent sidewall surface of the gate structure is a first distance. The semiconductor structure also includes a second doped source/drain layer formed on the first doped source/drain layer at both sides of the gate structure. A minimum distance between a sidewall surface of the second doped source/drain layer and an adjacent sidewall surface of the gate structure is a second distance. The second distance is greater than the first distance.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
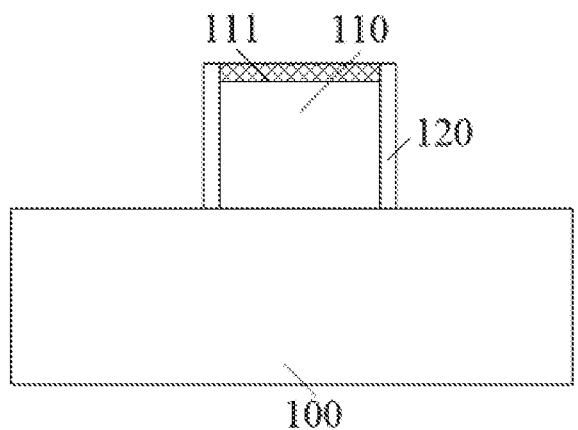
FIGS. 1-2 illustrate structures corresponding to certain stages during a fabrication process of a semiconductor structure.
Figure 2:
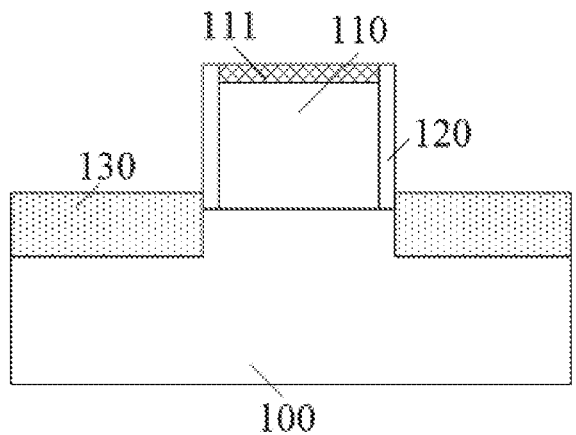

FIGS. 1-2 illustrate structures corresponding to certain stages during a fabrication process of a semiconductor structure. As shown in FIG. 1, the fabrication process includes providing a semiconductor substrate 100; forming a gate structure 110 having a mask layer 111, on the semiconductor substrate 100; and forming sidewall spacers 120 on the sidewall surfaces of the gate structure 110.

Further, as shown in FIG. 2, a first doped source/drain layer 130 is formed in the semiconductor substrate 100 at both sides of the gate structure 110. Conductive plugs connecting with the first doped source/drain layer 130 are subsequently formed.

The sidewall spacers 120 are used to define the distance between the first doped source/drain layer 130 and the gate structure 110. If the thickness of the sidewall spacers 120 is too large, the distance between the first doped source/rain layer 130 and the gate structure 110 is relatively large; and the stress provided to the channel region is relatively small. Accordingly, the carrier mobility of the channel region is relatively low. Further, to reduce the stress applied by the plugs to the semiconductor substrate 100, the top surface of the doped source/drain layer 120 is above the top surface of the semiconductor substrate 100. The doped source/drain layer 130, the sidewall spacers 120 and the gate structure 110 form parasitic capacitors. If the thickness of the sidewall spacers 120 is too small, the distance between the first doped source/rain layer 130 and the gate structure 110 is relatively small; and the parasitic capacitances of the parasitic capacitors formed by the gate structure 110, the sidewall spacers 120 and the first doped source/drain layer 130 are relative large. Accordingly, the performance of the semiconductor structure is adversely affected. Therefore, it is difficult to ensure the channel region of the semiconductor structure to have a relatively high carrier mobility and the parasitic capacitors to have relative small capacitances simultaneously.

The present disclosure provides a semiconductor structure and a fabrication method. The disclosed method may include forming a first doped source/drain region at both sides of the gate structure. The minimum distance between the sidewall surface of the first doped source/drain layer and the adjacent sidewall surface of the gate structure is a first distance. The method may also include forming a second doped source/drain layer on the first doped source/drain layer. The minimum distance between the face of the second doped source/drain layer and the adjacent sidewall surface of the gate structure is a second distance. The second distance may be greater than the first distance. The distance between the first doped source/drain layer and the gate structure may be relatively small, the first doped source/drain layer may generate a relatively large stress to the channel region. Thus, the carrier mobility of the channel region may be increased. The distance between the second doped source/drain layer and the gate structure may be relatively large. Thus, the parasitic capacitance between the gate structure and the second doped source/drain layer may be reduced. Thus, the performance of the semiconductor structure may be improved.

Figure 10:
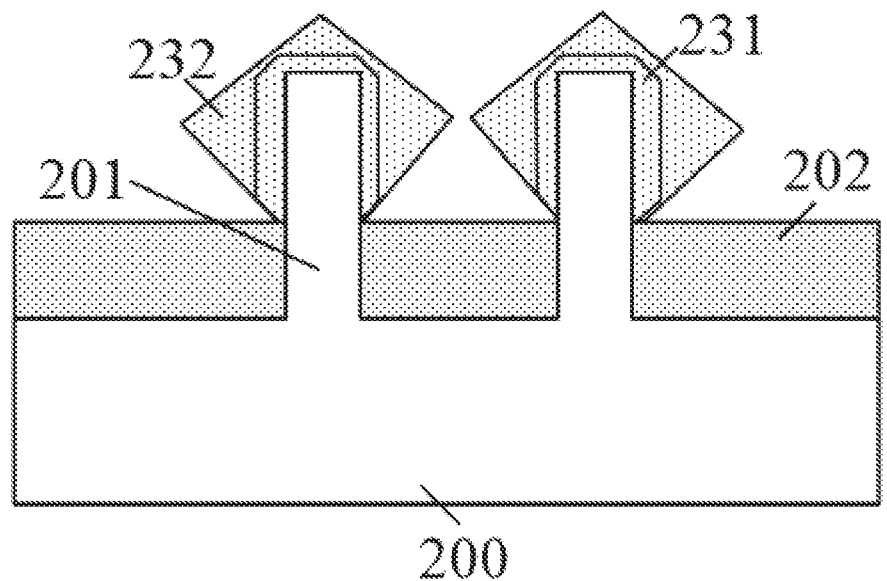
Figure 11:
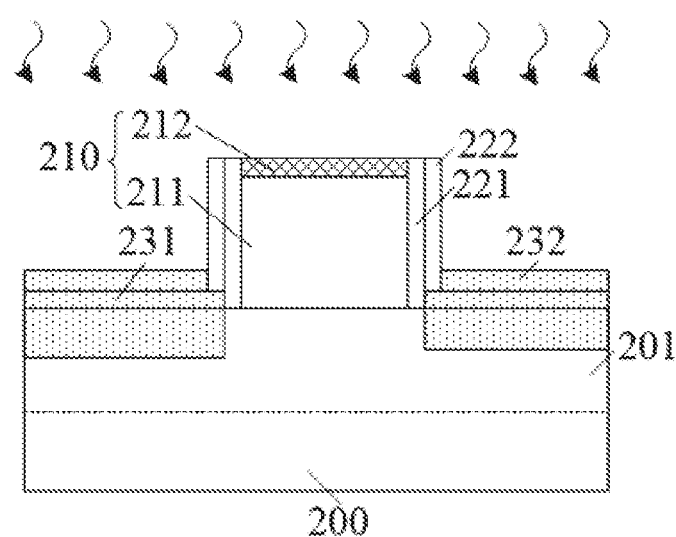
Figure 12:
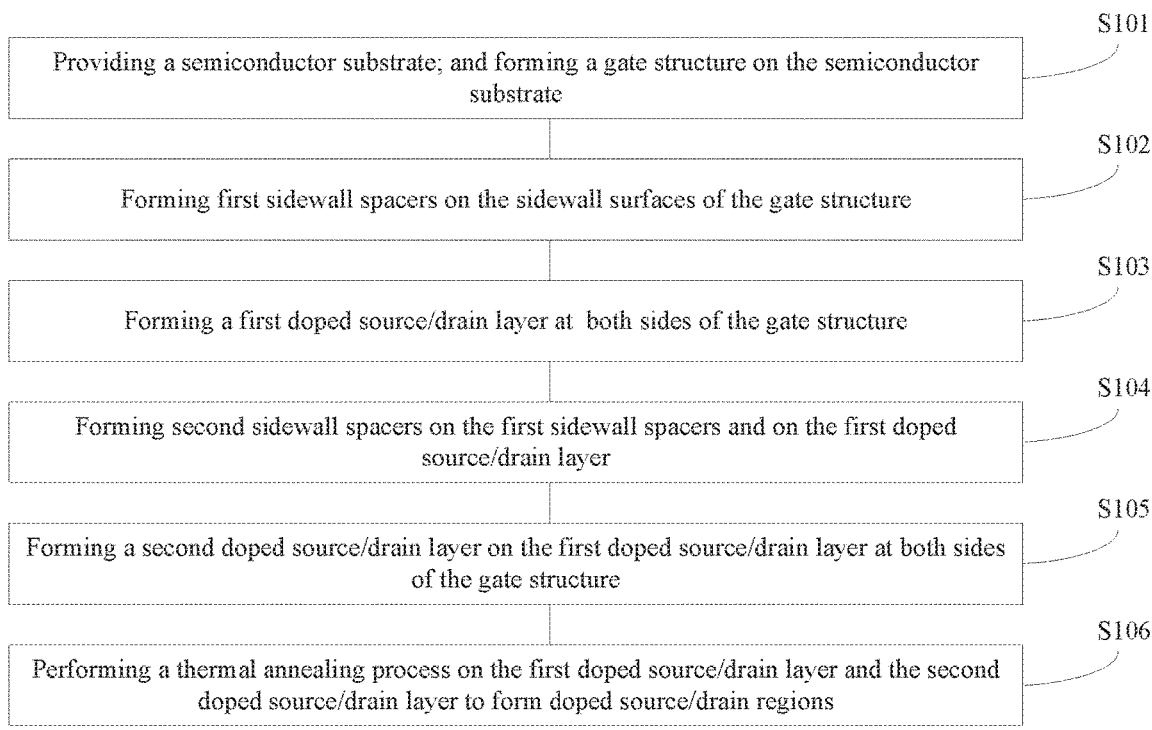
FIG. 12 illustrates an exemplary fabrication process of a semiconductor structure consistent with various disclosed embodiments.

FIG. 12 illustrates an exemplary fabrication process of a semiconductor structure consistent with various disclosed embodiments. FIGS. 3-11 illustrate structures corresponding to certain stages during the exemplary fabrication process.

Figure 3:
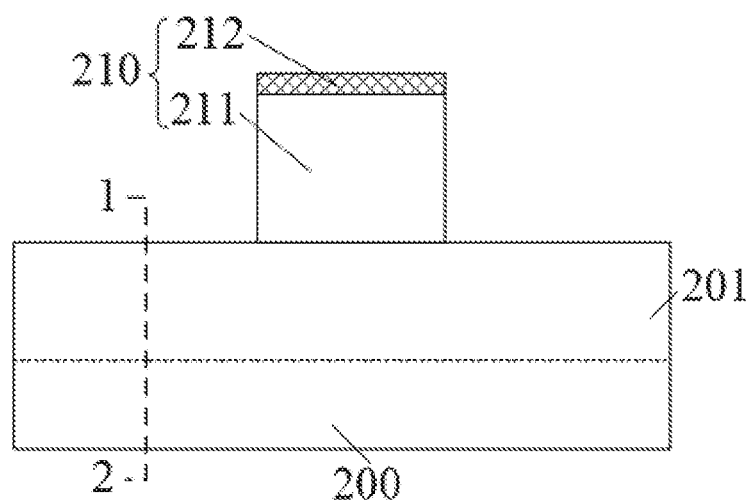
FIGS. 3-11 illustrate structures corresponding to certain stages during an exemplary fabrication process of a semiconductor structure consistent with various disclosed embodiments.
Figure 4:
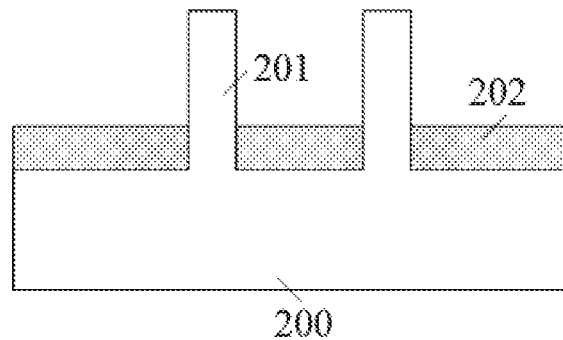

As shown in FIG. 12, at the beginning of the fabrication process, a semiconductor substrate with certain structures is provided (S101). FIGS. 3-4 illustrate a corresponding semiconductor structure. FIG. 4 illustrates a cross-sectional view of the structure illustrated in FIG. 3 along the line "1-2".

As shown in FIGS. 3-4, a base substrate is provided. A gate structure 210 may be formed on the base substrate.

In one embodiment, the base substrate includes a semiconductor substrate 200 and a plurality of fins 201 on the semiconductor substrate 200. Further, an isolation structure 202 may be formed on the semiconductor substrate 200. In some embodiments, the base substrate may also be a planar substrate, such a silicon substrate, a germanium substrate, a silicon germanium substrate, an silicon on insulator (SOI) substrate, or a germanium on insulator (GOI) substrate, etc.

In one embodiment, the semiconductor substrate 200 is made of silicon. In some embodiments, the semiconductor substrate may include a bottom semiconductor substrate and a top semiconductor substrate on the bottom semiconductor substrate. The bottom semiconductor substrate may be made of silicon, etc. The top semiconductor substrate may be made of a stress relaxed indium phosphate (InP), gallium arsenide (GaAs), or indium gallium arsenide (InGaAs), etc. The thickness of the top semiconductor substrate may be in a range of approximately 1 µm-10 µm.

In one embodiment, the semiconductor structure may be a PMOS transistor. The fins 201 may be made of compressively strained silicon germanium. In one embodiment, when the fins 201 are made of compressively strained silicon germanium. The height of the fins 201 may be in a range of approximately 20 nm-100 nm.

In some embodiments, the semiconductor substrate may include a silicon-based substrate and a relaxation layer on the silicon-based semiconductor substrate. When the semiconductor structure is a PMOS transistor, the crystal lattice of the fins may be greater than the crystal lattice of the relaxation layer. The relaxation layer may be stress-relaxed silicon germanium, germanium, or silicon carbide, etc.; and the fins may be made of compressively strained silicon, germanium, silicon germanium, etc. For example, if the relaxation layer is made of stress-relaxed silicon germanium, the fins may be made of compressively-stressed silicon germanium; and the concentration of germanium in the fins may be greater than the concentration of the germanium in the relaxation layer. If the relaxation layer is made of stress-relaxed silicon carbide, the fins may be made of compressively-stressed silicon carbide; and the concentration of carbon in the fins may be smaller than the concentration of carbon in the relaxation layer.

When the relaxation layer is made of silicon germanium or silicon, the fins are made of silicon germanium or germanium, the concentration of germanium in the relaxation layer may be in a range of approximately 5%-100%; and the concentration of germanium in the fins may be greater than the concentration of germanium in the relaxation layer. When the relaxation layer is made of silicon carbide, the fins are made of silicon carbide or silicon, the concentration of carbon in the relaxation layer may be in a range of approximately 0.1%-5%; and the concentration of carbon in the fins may be smaller than the concentration of carbon in the relaxation layer.

When the semiconductor structure is an NMOS transistor, the crystal lattice of the fins may be smaller than the crystal lattice of the relaxation layer. The relaxation layer may be stress-relaxed silicon germanium, germanium, or silicon carbide, etc.; and the fins may be made of tensile-stressed silicon, germanium, or silicon germanium, etc. For example, if the relaxation layer is made of stress-relaxed silicon germanium, the fins may be made of tensile-stressed silicon germanium; and the concentration of germanium in the fins may be smaller than the concentration of the germanium in the relaxation layer. If the relaxation layer is made of stress-relaxed silicon carbide, the fins may be made of tensile-stressed silicon carbide; and the concentration of carbon in the fins may be greater than the concentration of carbon in the relaxation layer.

When the relaxation layer is made of silicon germanium or germanium, the fins are made of silicon germanium or silicon, the concentration of germanium in the relaxation layer may be in a range of approximately 5%400%; and the concentration of germanium in the fins may be smaller than the concentration of germanium in the relaxation layer. When the relaxation layer is made of silicon carbide or silicon, the fins are made of silicon carbide, the concentration of carbon in the relaxation layer may be in a range of approximately 0.1%-5%; and the concentration of carbon in the fins may be greater than, or approximately equal to the concentration of carbon in the relaxation layer. The thickness of the relaxation layer may be in a range of 0.1 µm-10 µm.

In one embodiment, the isolation structure may be formed on the semiconductor substrate 200. The isolation structure 202 may cover portions of the sidewall surfaces of the fins 201. The top surface of the isolation structure 202 may be lower than the top surfaces of the fins 201.

In one embodiment, the gate structure 210 may cross over the fins 201. The gate structure 210 may cover portions of the sidewall surfaces and top surfaces of the fins 201.

The gate structure 210 may include a gate dielectric layer (not shown) on the surface of the base substrate, and a gate electrode layer 211 on the gate dielectric layer. A mask layer 212 may be formed on the gate electrode layer 211.

In one embodiment, the gate dielectric layer is made of silicon oxide. In some embodiments, the gate dielectric layer may be made of a high dielectric constant (high-K) dielectric material.

In one embodiment, the gate electrode layer 211 is made of polycrystalline silicon, polycrystalline germanium, and polycrystalline silicon germanium, etc. In some embodiments, the gate electrode layer may be made of metal, etc.

The mask layer 212 may be made of any appropriate material. In one embodiment, the mask layer 212 is made of silicon nitride.

Figure 5:
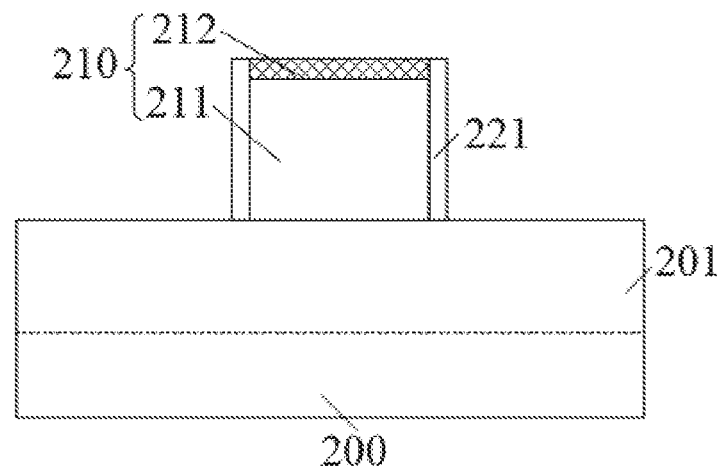

Returning to FIG. 12, after forming the gate structure, first sidewall spacers may be formed (S102). FIG. 5 illustrates a corresponding semiconductor structure.

As shown in FIG. 5, first sidewall spacers 221 may be formed on the sidewall surfaces of the gate structure 210. Each first sidewall spacer 221 may be formed on a sidewall surface of the gate structure 210.

The first sidewall spacers 221 may be used to define the distance between the gate structure 210 and the subsequently formed first doped source/drain layer.

In one embodiment, the first sidewall spacers 221 are made of silicon nitride, silicon oxide, silicon oxynitride, silicon oxycarbide, or silicon carbonitride, etc.

The process for forming the first sidewall spacers 221 may include forming a first sidewall spacer layer on the top surface and the sidewall surfaces of the gate structure 210 and the top surface of the base substrate; and removing the portions of the first sidewall spacer layer on the top surface of the gate structure 210 and the top surface of the base substrate.

The first sidewall spacer layer may be formed by any appropriate process, such as a chemical vapor deposition (CVD) process, or a physical vapor deposition (PVD) process, etc.

The portions of the sidewall spacer layer on the top surface of the gate structure and the base substrate may be removed by an anisotropic dry etching process. The lateral etching rate of the anisotropic dry etching process may be smaller than the vertical etching rate of the anisotropic dry etching process. Thus, the portions of the first sidewall spacer layer on the sidewall surfaces of the gate structure may not be easily removed.

The thickness of each of the first sidewall spacers 221 may be any appropriate value. If the thickness of the first sidewall spacer 221 is too small, the distance between the gate structure 210 and the subsequently formed first doped source/drain layer may be too small; and the capacitances of the capacitors formed by the first doped source/drain layer, the first sidewall spacers 221 and the gate structure 210 may be increased. Further, the distance between the gate structure 210 and the subsequently formed first doped source/drain layer is too small, the short-channel effect may be increased; and the performance of the semiconductor substrate may be adversely affected. If the thickness of the first sidewall spacer 221 is too large, the distance between the portion of the base substrate under the gate structure 210 and the subsequently formed first doped source/drain layer may be too large. Thus, the subsequently formed first doped source/drain layer may be unable to provide a sufficiently large stress to the channel region; and the carrier mobility of the channel region may be relatively low. Thus, in one embodiment, the thickness of the first sidewall spacer 221 may be in a range of approximately 2 nm-10 nm.

Figure 6:
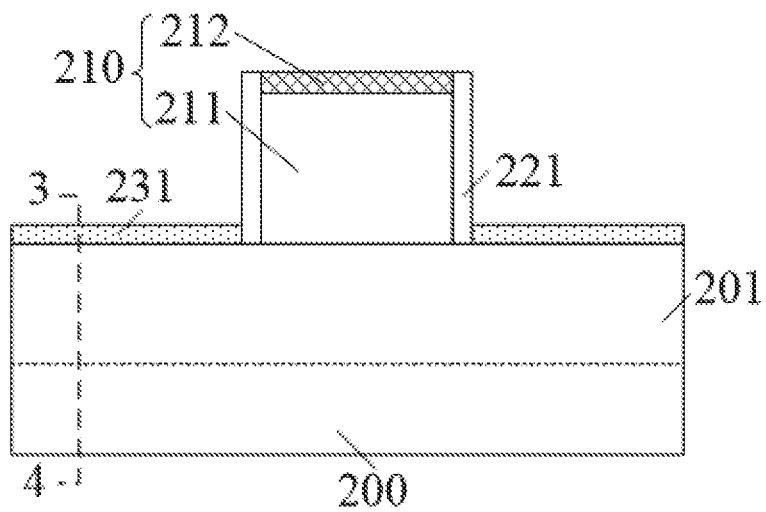
Figure 7:
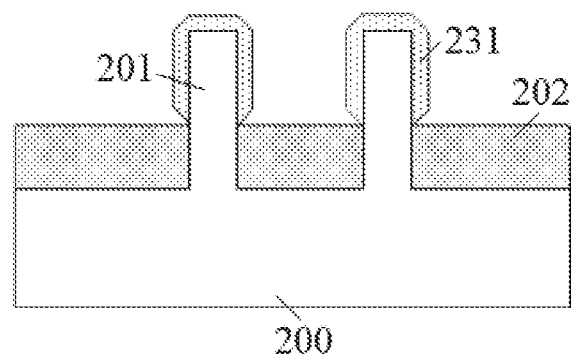

Returning to FIG. 12, after forming the first sidewall spacers, a first doped source/drain layer may be formed (S103). FIGS. 6-7 illustrate a corresponding semiconductor structure. FIG. 7 is a cross-sectional view of the structure illustrated in FIG. 6 along line "3-4".

As shown in FIGS. 6-7, a first doped source/drain layer 231 is formed at both sides of the gate structure 230. The minimum distance between the sidewall surface of the first doped source/drain layer 231 and an adjacent sidewall surface of the gate structure 230 is a first distance.

The smaller the first distance is, the closer to the channel region of the semiconductor structure the gate structure 210 is; and the larger the stress applied to the channel region is. Oppositely, the larger the first distance is, the further to the channel region of the semiconductor structure the gate structure 210 is; and the smaller the stress applied to the channel region is.

The first doped source/drain layer 231 and the gate structure 210 may only have one of the first sidewall spacers 221 in between. Thus, the first distance may be determined by the thickness of the first sidewall spacer 221.

Because the first distance may be relatively small, the first doped source/drain layer 231 may be relatively close to the channel region of the semiconductor structure, the first doped source/drain layer 231 may be able to provide a relatively large stress to the channel region of the semiconductor structure. Accordingly, the carrier mobility of the channel region may be increased. Further, when the thickness of the first doped source/drain layer 231 is relatively small, the capacitance between the first doped source/drain layer 231 and the gate structure 210 may be reduced.

In one embodiment, the first doped source/drain layer 231 may be formed on the surface of the base substrate at both sides of the gate structure 210. For example, the first doped source/drain layer 231 may be formed on portions of the surfaces of the fins 201 at both sides of the gate structure 210. Forming the first doped source/drain layer 231 over the base substrate at both sides of the gate structure 210 may simplify the fabrication process; and reduce the production cost.

In some embodiments, the first doped source/drain layer may be formed in/inside the base substrate at both sides of the gate structure. The process for forming the first doped source/drain layer in the base substrate may include etching the base substrate at both sides of the gate structure to form trenches using the first sidewall spacers and the gate structure as an etching mask; and forming the first doped source/drain layer in the trenches. The first doped source/drain layer may be formed in the base substrate at both sides of the gate structure, the top surface of the first doped source/drain layer may level with, or may be below the top surface of the base substrate. When the top surface of the first doped source/drain layer levels with, or is below the top surface of the base substrate, the overlap between the projection of the first doped source/drain layer on the sidewall surface of the gate structure and the sidewall surface of the gate structure may be relatively small. Thus, the capacitance of the capacitor formed by the first doped source/drain layer and the gate structure may be relatively small; and the performance of the semiconductor structure may be improved. In some embodiments, the top surface of the first doped source/drain layer may be above the top surface of the base substrate.

In one embodiment, the process for forming the first doped source/drain layer 231 may include forming a first epitaxial layer on the base substrate at both sides of the gate structure 210 using the gate structure 210 and the first sidewall spacers 221 as a mask; and performing a first doping process on the first epitaxial layer to form the first doped source/drain layer 231.

The first epitaxial layer may be formed by any appropriate process. In one embodiment, the first epitaxial layer is formed by a first epitaxial growth process.

In one embodiment, the first doping process is an in-situ doping process. In some embodiments, the first doping process may be an ion implantation process, etc.

In one embodiment, the semiconductor structure is a PMOS transistor, the first epitaxial layer is made of silicon germanium. The doping source of the first doping process may be a boron atom source. In some embodiments, the first doping process is an ion implantation process, the doping source may be a boron ion source, or a $BF_2^+$ ion source, etc.

In some embodiments, the semiconductor structure is a NMOS transistor, the first epitaxial layer is made of silicon carbide. The doping source of the first doping process may be phosphorus ions, arsenic ions, phosphorus atoms, or arsenic atoms, etc.

The thickness of the first doped source/drain layer 231 may be any appropriate value. If the thickness of the first doped source/drain layer 231 is too large, the overlap area between the projection of the first doped source/drain layer 231 on the sidewall surface of the gate structure 210 and the sidewall surface of the gate structure 210 may be relatively large. Further, the distance between the first doped source/drain layer 231 and the gate structure 210 may be relatively small, the parasitic capacitance of the semiconductor structure may be relatively large. If the thickness of the first doped source/drain layer is too small, the first doped source/drain layer 231 may be unable to provide a sufficiently large stress to the channel region of the semiconductor structure. In one embodiment, the thickness of the first doped source/drain layer 231 may be in a range of approximately 2 nm-12 nm.

The doping concentration of the first doped source/drain layer 231 may be any appropriate value. If the doping concentration of the first doped source/drain layer 231 is too low, the doping concentration of the subsequently formed first doped source/drain regions may be relatively low. The electrical properties of the doped source/drain regions may be affected. If the doping concentration of the first doped source/drain layer 231 is too large, it may be easy to have a waste of material; and the junction leakage current may be increased. In one embodiment, the doping concentration of the first doped source/drain layer 231 may be in a range of approximately $1E17$ atoms/cm$^3$-$1E21$ atoms/cm$^3$.

Figure 8:
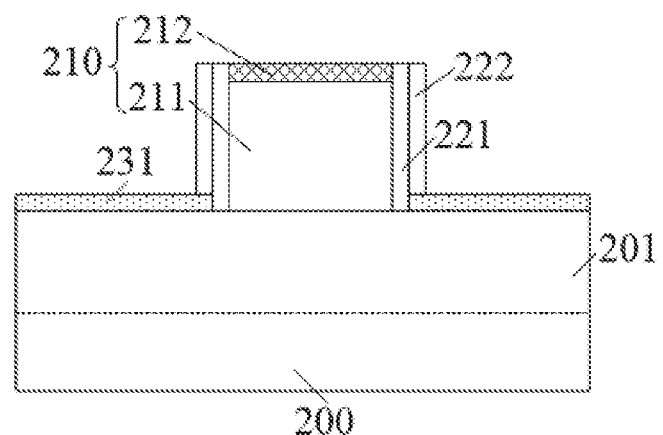

Returning to FIG. 12, after forming the first doped source/drain layer, second sidewall spacers may be formed (S104). FIG. 8 illustrates a corresponding semiconductor structure.

As shown in FIG. 8, second sidewall spacers 222 are formed on the first sidewall spacers 221. Each of the second sidewall spacers may be formed on a first sidewall spacer 221. The second sidewall spacers 222 may be used to define the distance between the subsequently formed second doped source/drain layer and the first sidewall spacers 231.

In one embodiment, the second sidewall spacers 222 are made of silicon nitride. In some embodiments, the second sidewall spacers may be made of silicon oxide, silicon oxynitride, silicon carbonitride, or silicon oxycarbide, etc.

The process for forming the second sidewall spacers 222 may include forming a second sidewall spacer layer on the sidewall surfaces of the first sidewall spacers 221, the top surface of the gate structure 210 and the first doped source/drain layer 231; and removing the portions of the second sidewall spacer layer on the top surface of the gate structure 210 and the top surface of the first doped source/drain layer 231 to form the second sidewall spacers 222.

The second sidewall spacer layer may be formed by any appropriate process, such as a CVD process, or a PVD process, etc.

The portions of the second sidewall spacer layer on the top surface of the gate structure 210 and the top surface of the first doped source/drain layer 231 may be removed by an anisotropic dry etching process. The lateral etching rate of the anisotropic dry etching process may be smaller than the vertical etching rate of the anisotropic dry etching process. Thus, the portions of the second sidewall spacer layer on the sidewall surfaces of the first sidewall spacers 221 may not be easily removed.

The thickness of the second sidewall spacers 222 may be any appropriate value. If the thickness of the second sidewall spacers 222 is too small, the distance between the gate structure 210 and the subsequently formed second doped source/drain layer may be too small; and the capacitance of the capacitor formed by the second doped source/drain layer, the second sidewall spacers 222 and the gate structure 210 may be increased. Further, the distance between the portion of the base substrate under the gate structure 210 and the subsequently formed second doped source/drain layer is too small, the short-channel effect may be increased; and the performance of the semiconductor structure may be adversely affected. If the thickness of the second sidewall spacers 222 is too large, the distance between the portion of the base substrate under the gate structure 210 and the subsequently formed second doped source/drain layer may be too large. Thus, the subsequently formed second doped source/drain layer may be unable to provide a sufficiently large stress to the channel region; and the carrier mobility of the channel region may be relatively low. Thus, in one embodiment, the thickness of the second sidewall spacer 222 may be in a range of approximately 3 nm-15 nm.

Figure 9:
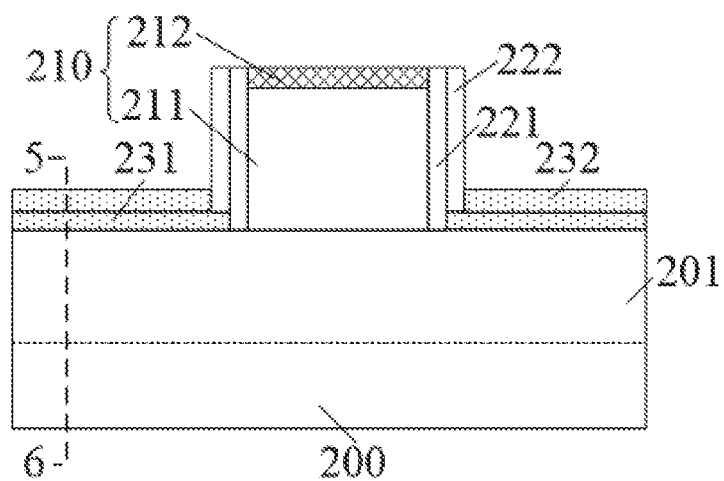

Returning to FIG. 12, after forming the second sidewall spacers, a second doped source/drain layer may be formed (S105). FIGS. 9-10 illustrate a corresponding semiconductor structure. FIG. 10 is a cross-sectional view of the structure illustrated in FIG. 9 along "5-6".

As shown in FIGS. 9-10, a second doped source/drain layer 232 is formed on the first doped source/drain layer 231. The minimum distance between a sidewall surface of the second doped source/drain layer 232 and an adjacent sidewall surface of the gate structure 210 is a second distance. The second distance is greater than the first distance.

In one embodiment, the second distance is determined by the total thickness of the first sidewall spacer 221 and the second sidewall spacer 222. The first sidewall spacer 221 and the second sidewall spacer 222 may be between the gate structure 210 and the second doped source/drain layer 232. Thus, the second distance may be relatively large.

In one embodiment, the first doped source/drain layer 231 may be formed on the surface of the base substrate, the first doped source/drain layer 231 may be above the top surfaces of the fins 201. The second doped source/drain layer 231 may be formed on the surface of the first doped source/drain layer 231 at both sides of the gate structure 210. Thus, the top surface of the second doped source/drain layer 232 may be above the top surfaces of the fins 201. The second doped source/drain layer 232, the first sidewall spacers 221, the second sidewall spacers 222 and the gate structure 210 may form parasitic capacitors. Because the distance between the first doped source/drain layer 231 and the gate structure 210 may be relatively small, the first doped source/drain layer 231 may able to provide a relatively large stress to the channel region. Accordingly, the carrier mobility of the channel region may be increased. Further, the first sidewall spacer 221 and the second sidewall spacer 222 may be between the gate structure 210 and the second doped source/drain layer 232, the distance between the second doped source/drain layer 232 and the gate structure 210 may be relatively large. Accordingly, the parasitic capacitance of the parasitic capacitor may be relatively small. Thus, the disclosed fabrication method may be able to allow the semiconductor structure to have a relatively high carrier mobility and a relatively small parasitic capacitance simultaneously.

In some embodiments, the second doped source/drain layer may also be formed in the semiconductor substrate at both sides of the gate structure, the top surface of the second doped source/drain layer may be below or level with the top surface of the base substrate. When the top surface of the second doped source/drain layer is below or levels with the top surface of the base substrate, the overlap area between the projection of the second doped source/drain layer on the sidewall surface of the gate structure and the sidewall surface of the gate structure may be relatively small. Thus, the parasitic capacitance formed by the second doped source/drain layer and the gate structure may be relatively small; and the performance of the semiconductor structure may be improved. The surface of the second doped source/drain layer may also be above the top surface of the base substrate.

In one embodiment, the process for forming the second doped source/drain layer 232 may include forming a second epitaxial layer on the first doped source/drain layer 231 at both sides of the gate structure 210 using the gate structure 210, the first sidewall spacers 221 and the second sidewall spacers 222 as a mask; and performing a second doping process on the second epitaxial layer to form the second doped source/drain layer 232.

The second epitaxial layer may be formed by any appropriate process, such as a second epitaxial growth process.

In one embodiment, the second doping process may be an in situ doping process. In some embodiments, the second doping process may be an ion implantation process.

In one embodiment, the semiconductor structure is a PMOS transistor, the second epitaxial layer is made of silicon germanium. The doping source of the second doping process may be a boron atom source. In some embodiments, the second doping process is an ion implantation process, the doping source of the ion implantation process may be boron ions, or $BF_2^+$ ions, etc.

In some embodiments, the semiconductor structure may be an NMOS transistor, the second epitaxial layer may be made of silicon carbide. The doping source of the second doped source/drain layer may include phosphorus atoms, arsenic atoms, phosphorus ions, or arsenic ions, etc.

The size of the second doped source/drain layer 232 may be any appropriate value. If the size of the second doped source/drain layer 232 is too large, the projection of the second doped source/drain layer 232 on the sidewall surface of the gate structure 210 may be increased. Accordingly, the parasitic capacitance of the semiconductor structure may be increased. If the size of the second doped source/drain layer 232 is too small, the doping concentration of the subsequently formed doped source/drain regions may be relatively small; and the electrical properties of the second doped source/drain layer 232 may be affected. For example, in one embodiment, the size from the top surface of the second doped source/drain layer 232 to the first doped source/drain layer 231 may be in a range of approximately 8 nm-18 nm; and the distance from the top surface of the second doped source/drain layer 232 to the top surfaces of the fins 201 may be in a range of approximately 10 nm-30 nm.

In some embodiments, the entire first doped source/drain layer and the entire second doped source/drain layer or portions of the first doped source/drain layer and portions of the second doped source/drain layer may be formed in the base substrate at both sides of the gate structure. The distance from the top surface of the second doped source/drain layer and the top surfaces of the fins may be in a range approximately 0 nm-10 nm.

The doping concentration of the second doped source/drain layer 232 may be any appropriate value. If the doping concentration of the second doped source/drain layer 232 is too low, the doping concentration of the subsequently formed doped source/drain regions may also be relatively low. Thus, the electrical properties of the doped source/drain regions may be affected. If the doping concentration of the second doped source/drain layer 232 is too high, it may cause a waste of material; and the junction leakage current may be increased. Thus, in one embodiment, the doping concentration of the second doped source/drain layer 232 may be in a range of approximately $1E17$ atoms/cm$^3$-$1E21$ atoms/cm$^3$.

Returning to FIG. 12, after forming the second doped source/drain layer, a thermal annealing process may be performed (S106). FIG. 11 illustrates a corresponding semiconductor structure.

As shown in FIG. 11, a thermal annealing process is performed on the first doped source/drain layer 231 and the second doped source/drain layer 232.

The thermal annealing process may be used to activate the doping ions in the first doped source/drain layer 231 and the second doped source/drain layer 232; and cause the doping ions to diffuse toward the fins 201 to form doped source/drain regions.

In one embodiment, the thermal annealing process may be a rapid thermal treatment process, or a furnace thermal annealing process.

The temperature of the thermal annealing process may be any appropriate value. If the temperature of the thermal annealing process is too low, the diffusion of the doping ions of the first doped source/drain layer 231 and the second doped source/drain layer 232 may be affected. If the temperature of the thermal annealing process is too high, the instrument requirements may be increased; and the production cost may be increased. In one embodiment, when the thermal annealing process is a rapid thermal treatment process, the temperature of the thermal annealing process may be in a range of approximately 800° C.-1200° C. When the thermal annealing process is a furnace thermal annealing process, the temperature of the thermal annealing process may be in a range of approximately 600° C.-900° C.

The present disclosure also provides a semiconductor structure. FIGS. 9-10 illustrate a corresponding semiconductor structure.

As shown in FIGS. 9-10, the semiconductor structure may include a base substrate; a gate structure 210 on the base substrate and a first doped source/drain layer 231 on the base substrate at both sides of the gate structure 210. A minimum distance between the sidewall surface of the first doped source/drain layer 231 and an adjacent sidewall surface of the gate structure 210 is a first distance. The semiconductor structure may also include a second doped source/drain layer 232 on the first doped source/drain layer 231 at both sides of the gate structure 210. A minimum distance between the sidewall surface of the second doped source/drain layer 232 and the adjacent sidewall surface of the gate structure 210 is a second distance. The second distance may be greater than the first distance. The semiconductor structure may also include first sidewall spacers 221 covering the sidewall surfaces of the gate structure 210; and the first doped source/drain layer 231 may be at both sides of the first sidewall spacers 221. Further, the semiconductor structure may include second sidewall spacers 222; and the second sidewall spacers 222 may be at both sides of the first sidewall spacers 221. The detailed structures and intermediate structures are described above with respect to the fabrication processes.

The thickness of each of the first sidewall spacers 221 may be in a range of approximately 2 nm-10 nm. The thickness of each of the second sidewall spacers 222 may be in a range of approximately 3 nm-15 nm.

The first sidewall spacers 221 and the second sidewall spacers 222 may be made of silicon nitride, silicon oxide, silicon oxynitride, silicon oxycarbide, or silicon carbonitride, etc.

The first doped source/drain layer 231 may be on the surface of the base substrate at both sides of the gate structure 210. In some embodiments, the first doped source/drain layer 231 may be in the base substrate at both sides of the gate structure 210.

The base substrate may include a semiconductor substrate 200 and a plurality of fins 201 on the semiconductor substrate 200.

The semiconductor substrate 200 and the fins 201 may be made of silicon. The first doped source/drain layer 231 and the second doped source/drain layer 232 may be doped with appropriate doping ions.

The first doped source/drain layer 231 and the second doped source/drain layer 232 may be made of silicon germanium. The doping ions doped in the first doped source/drain layer 231 and the second doped source/drain layer 232 may include boron atoms, boron ions, or $BF_2^+$ ions, etc. In some embodiments, the first doped source/drain layer 231 and the second doped source/drain layer 232 may be made of silicon carbide. The doping ions doped in the first doped source/drain layer 231 and the second doped source/drain layer 232 may include phosphorus atoms, arsenic atoms, phosphorus ions, or arsenic ions, etc.

The thickness of the first doped source/drain layer 231 may be in range of approximately 2 nm-12 nm. The distance between the top surface of the second doped source/drain layer 232 and the top surface of the first doped source/drain layer 231 may be in a range of approximately 8 nm-18 nm.

In the disclosed method for fabricating a semiconductor structure, the second distance may be greater than the first distance. Because the distance between the first doped source/drain layer and the gate structure may be relatively small, the first doped source/drain layer may be able to provide a relatively large stress to the channel region; and the carrier mobility of the channel region may be increased. Further, the distance between the second doped source/drain layer and the gate structure may be relatively large, the capacitance between the gate structure and the second doped source/drain layer may be relatively small. Thus, the disclosed method may be able to increase the carrier mobility of the channel region; and reduce the parasitic capacitance of the semiconductor structure simultaneously.

Further, the top surface of the second doped source/drain layer may be above the top surface of the base substrate, the second doped source/drain layer, the first sidewall spacers, the second sidewall spacers and the gate structure may form parasitic capacitors. Because only the first sidewall spacer may be between the first doped source/drain layer and the gate structure, the distance between the first doped source/drain layer and the gate structure may be relatively small, the first doped source/drain layer and the gate structure may be able to provide a relatively large stress to the channel region. Thus, the carrier mobility of the channel region may be increased. Further, because both the first sidewall spacer and the second sidewall spacer may be between the second doped source/drain layer and the gate structure, the distance between the second doped source/drain layer and the gate structure may be relatively large. Thus, the parasitic capacitance of the semiconductor structure may be relatively small. Thus, the semiconductor structure formed by the disclosed method may have advantages of a relatively large carrier mobility and a relatively small parasitic capacitor simultaneously.

In the disclosed semiconductor structure, the second distance may be smaller than the first distance. Because the distance between the first doped source/drain layer and the gate structure may be relatively small, the first doped source/drain layer may be able to provide a relative large stress to the channel region; and the carrier mobility of the channel region may be increased. Further, the distance between the second doped source/drain layer and the gate structure may be relatively large, the capacitance between the gate structure and the second doped source/drain layer may be reduced. Thus, the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate;
   forming a gate structure on a top surface of the base substrate;
   forming a first doped source/drain layer on the base substrate at both sides of the gate structure, wherein a minimum distance between a sidewall surface of the first doped source/drain doping layer and an adjacent sidewall surface of the gate structure is a first distance; and
   forming a second doped source/drain layer on the first doped source/drain layer at both of the gate structure, wherein a minimum distance between a sidewall surface of the second doped source/drain doping layer and an adjacent sidewall surface of the gate structure is a second distance; and the second distance is greater than first distance, wherein:
   first sidewall spacers are formed on sidewall surfaces of the gate structure before forming the first doped source/drain layer;
   the first doped source/drain layer is formed at both sides of the first sidewall spacers;
   second sidewall spacers are formed on the first doped source/drain layer and on the first sidewall spacers before forming the second doped source/drain layer; and the second doped source/drain layer is formed on the first doped source/drain layer at both side of the second sidewall spacers.

2. The method according to claim 1, wherein:
the first doped source/drain layer is formed on the surface of the base substrate at both sides of the gate structure.

3. The method according to claim 2, wherein:
the first doped source/drain layer is formed by forming a first epitaxial layer on the surface of the base substrate using the gate structure and the first sidewall spacers as a mask, followed by performing a first doping process on the first epitaxial layer; and
the second doped source/drain layer is formed by forming a second epitaxial layer on a surface of the first doped source/drain layer at both sides of the gate structure using the gate structure, the first sidewall spacers and the second sidewall spacers as a mask, followed by performing a second doping process on the second epitaxial layer.

4. The method according to claim 3, further comprising:
performing a thermal annealing process on the first doped source/drain layer and the second doped source/drain layer.

5. The method according to claim 1, wherein:
the first doped source/drain layer is formed in the base substrate at both sides of the gate structure.

6. The method according to claim 5, wherein:
the first doped source/drain layer is formed by etching the base substrate using the gate structure and the first sidewall spacers as a mask to form trenches, forming a first epitaxial layer in the trenches, followed by performing a first doping process on the first epitaxial layer; and
the second doped source/drain layer is formed by forming a second epitaxial layer on a surface of the first doped source/drain layer at both sides of the gate structure, followed by performing a second doping process on the second epitaxial layer.

7. The method according to claim 1, wherein:
a thickness of the first sidewall spacer is in a range of approximately 2 nm-10 nm; and
a thickness of the second sidewall spacer is in a range of approximately 3 nm-15 nm.

8. The method according to claim 1, wherein:
each of the first sidewall spacers and the second sidewall spacers is made of one of silicon nitride, silicon oxide, silicon oxynitride, silicon oxycarbide and silicon carbonitride.

9. The method according to claim 1, wherein:
a surface of the second doped source/drain layer is above the top surface of the semiconductor substrate.

10. The method according to claim 1, wherein:
a thickness of the first doped source/drain layer is in a range of approximately 2 nm-12 nm; and
a thickness of the second doped source/drain layer is in a range of approximately 8 nm-18 nm.

11. The method according to claim 1, wherein the semiconductor substrate is made of silicon and the first doped source/drain layer and the second doped source/drain layer are doped with doping ions:
doping ions in the first doped source/drain layer and the second doped source/drain layer include one of boron atoms, boron ions and $BF_2^+$ ions when the first doped source/drain layer and the second doped source/drain layer are made of silicon germanium; and
doping ions in the first doped source/drain layer and the second doped source/drain layer include one of phosphorus atoms, arsenic atoms, phosphorus ions and arsenic ions when first doped source/drain layer and the second doped source/drain layer are made of silicon carbide.

12. A semiconductor structure, comprising:
a base substrate;
a gate structure formed on a top surface of the base substrate;
a first doped source/drain layer formed at both sides of the gate structure, wherein a minimum distance between a sidewall surface of the first doped source/drain layer and an adjacent sidewall surface of the gate structure is a first distance;
first sidewall spacers on sidewall surfaces of the gate structure and the base substrate, wherein the first doped source/drain layer is at both sides of the first sidewall spacers; and
a second doped source/drain layer formed on the first doped source/drain layer at both sides of the gate structure, wherein a minimum distance between a sidewall surface of the second doped source/drain layer and an adjacent sidewall surface of the gate structure is a second distance and the second distance is greater than the first distance; and
second sidewall spacers on the first sidewall spacers and directly on the first doped source/drain layer, wherein the second doped source/drain layer is at both sides of the gate structure.

13. The semiconductor structure according to claim 12, wherein:
a thickness of the first sidewall spacer is in a range of approximately 2 nm-10 nm; and
a thickness of the second sidewall spacer is in a range of approximately 3 nm-15 nm.

14. The semiconductor structure according to claim 12, wherein:
the first sidewall spacers and the second sidewall spacers are made of one of silicon nitride, silicon oxide, silicon oxynitride, silicon oxycarbide and silicon carbonitride.

15. The semiconductor structure according to claim 12, wherein:
a surface of the second doped source/drain layer is above the top surface of the semiconductor substrate.

16. The semiconductor structure according to claim 12, wherein:
the first doped source/drain layer is on the top surface of the base substrate.

17. The semiconductor structure according to claim 12, wherein the semiconductor substrate is made of silicon and the first doped source/drain layer and the second doped source/drain layer are doped with doping ions:
doping ions in the first doped source/drain layer and the second doped source/drain layer include one of boron atoms, boron ions and $BF_2^+$ ions when the first doped source/drain layer and the second doped source/drain layer are made of silicon germanium; and
doping ions in the first doped source/drain layer and the second doped source/drain layer include one of phosphorus atoms, arsenic atoms, phosphorus ions and arsenic ions when the first doped source/drain layer and the second doped source/drain layer are made of silicon carbide.

18. The semiconductor structure according to claim 12, wherein:
a thickness of the first doped source/drain layer is in a range of approximately 2 nm-12 nm; and a thickness of the second doped source/drain layer is a range of approximately 8 nm-18 nm.

* * * * *